United States Patent [19]

Schroeder

[11] Patent Number: 5,314,353
[45] Date of Patent: May 24, 1994

[54] TEST LEAD ADAPTER

[75] Inventor: Otto H. Schroeder, Houston, Tex.

[73] Assignee: Houston Industries Incorporated, Houston, Tex.

[21] Appl. No.: 23,562

[22] Filed: Feb. 26, 1993

[51] Int. Cl.⁵ .............................................. G01R 25/00
[52] U.S. Cl. ...................................... 439/517; 324/108
[58] Field of Search ............... 439/517, 146, 167, 912; 324/86, 108, 110, 156, 157, 508, 115, 72.5; 361/76

[56] References Cited

U.S. PATENT DOCUMENTS 2,218,650 10/1940 Larson ................................ 439/517
2,836,793 5/1958 Kelly .................................. 324/115
5,039,936 8/1991 Gonzales ............................ 324/108

Primary Examiner—Neil Abrams
Attorney, Agent, or Firm—Pravel, Hewitt, Kimball & Krieger

[57] ABSTRACT

An adapter is provided for adapting a voltage or phase rotation indicator for use with multiphase electrical power. The adapter allows the phase rotation indicator to be used in situations where it might not otherwise be used, such as when the power conductors are not contained in a power meter box. The adapter may also be used as a protective carrying or transport cover for the indicator when the indicator is not in use.

17 Claims, 2 Drawing Sheets

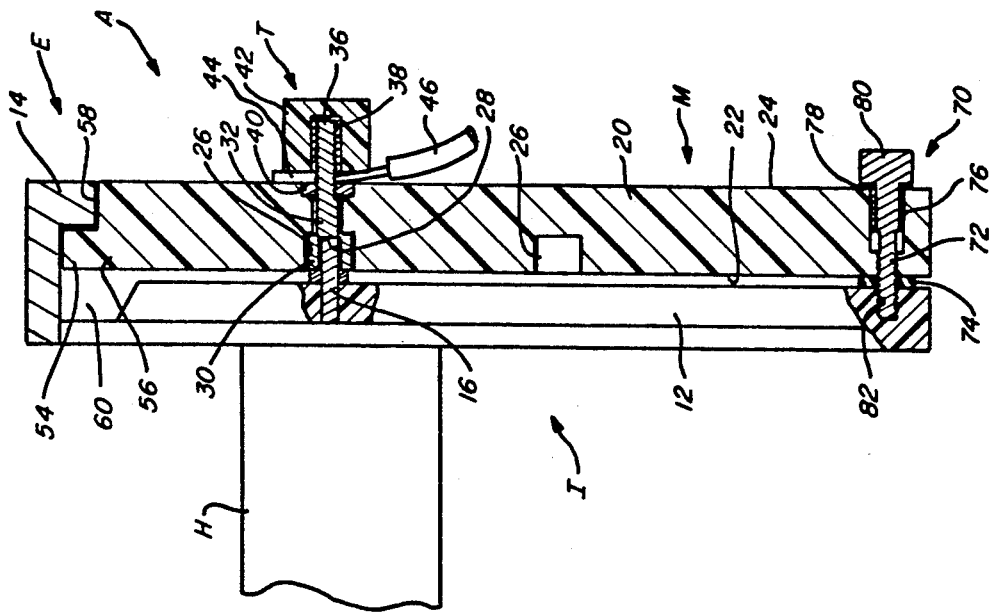
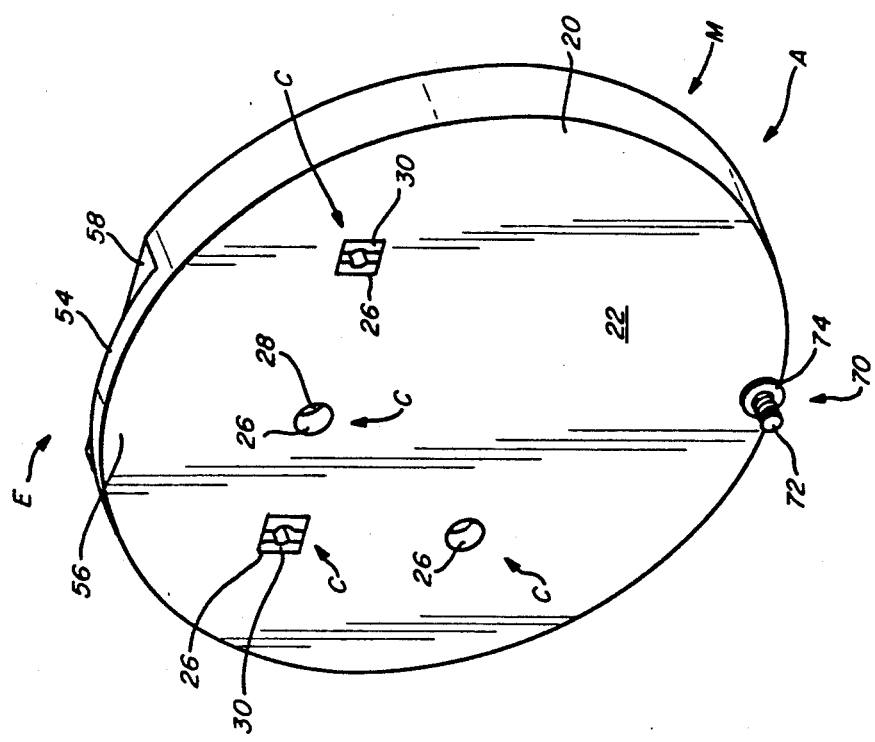

TEST LEAD ADAPTER

BACKGROUND OF THE INVENTION

1. Field of the Invention

The present invention relates to testing of electrical power distribution systems.

2. Description of Prior Art

In electrical power distribution it is necessary to test the phase sequence of multiphase electrical power using voltage or phase rotation indicators. In situations where the leads carrying such power are contained in a meter box or can, a mounting apparatus can be used to safely connect the test indicator to the power leads. An apparatus according to U.S. Pat. No. 5,039,936, owned by the assignee of the present application, is particularly suitable in these circumstances. This type of apparatus did away with the requirement that a service crew member insert a hand or hands into the meter box for test connection purposes. There were thus considerable safety reasons which made this type apparatus desirable.

There still remain numerous multiphase electrical power installations where the power leads to be tested for phase rotation are not contained in a meter box. Phase rotation must still be tested, however, on these leads. In these situations, additional types of test equipment would be needed.

One solution to this problem would be to use another type of phase rotation tester, one not mountable for use on meter boxes. This would result in undesirable equipment costs, since two types of phase rotation testers would be needed. Also, there were often space limitations on service trucks which made it undesirable to carry redundant items of test equipment.

SUMMARY OF THE INVENTION

Briefly, the present invention provides a new and improved adapter for connecting multiphase electrical power with electrical test contacts for a mounting apparatus of a phase rotation indicator, such as of the type disclosed in commonly owned U.S. Pat. No. 5,039,936. The phase rotation of the multiphase power can then be tested without requiring additional types of phase rotation testers in situations when the multiphase test points are not located in a meter box.

The adapter according to the present invention includes an insulative plate member on which are mounted terminals for connection via flexible test leads to each of the multiphase electrical power points. Electrical contacts are also mounted on the plate member and are electrically connected to the terminals. The electrical contacts may be either contact heads or connector jaws as the projected use situation may require. The electrical contacts are adapted for engagement with the electrical connectors of the phase rotation indicator. The plate member is also provided with structure to engage the mounting apparatus to align the electrical contacts with the electrical connectors of the phase rotation indicator. In this way, the phase indicator can be used in situations where the power conductors are not mounted in a meter box. The adapter is also provided with connection structure so that it may be mounted as a protective cover for the phase rotation indicator when it is not in use.

BRIEF DESCRIPTION OF THE DRAWINGS

FIG. 2 is a front isometric view of the test lead adapter of FIG. 1.

FIG. 3 is an elevation view, taken in cross-section, of the test lead adapter of FIG. 1.

DESCRIPTION OF PREFERRED EMBODIMENT

Figure 4:
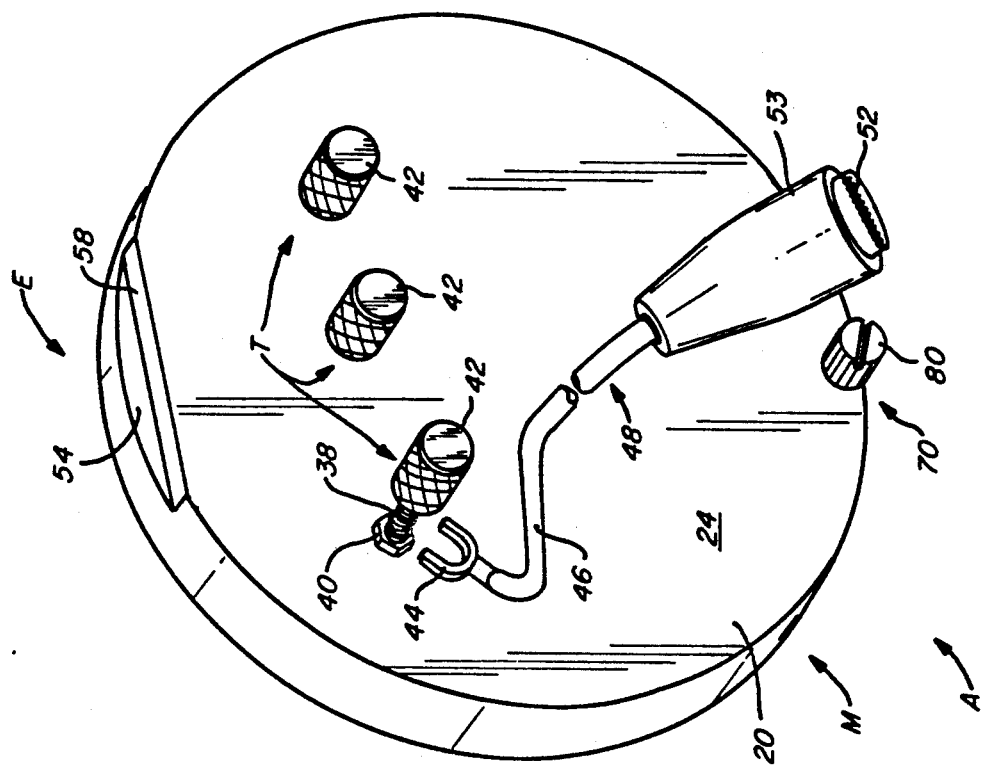
FIG. 4 is a rear isometric view of the test lead adapter of FIG. 1.

In the drawings, the letter A designates generally a test lead adapter according to the present invention. The test lead adapter A is used for connecting multiphase electrical power conductors or test points with a phase rotation indicator I of the type disclosed, for example, in commonly owned U.S. Pat. No. 5,039,936. The disclosure of this patent is incorporated herein by reference.

Briefly, the phase rotation indicator I has an electronic housing H with indicator lights 10 mounted on it. The housing H of the phase rotation indicator I is mounted on a face plate 12, which may be either circular or semi-circular. A hanger jaw 14 is mounted at an upper portion of the face plate 12 and has been used to attach the phase rotation indicator I to a meter box for testing the phase sequence of multiphase electrical power.

A suitable number and type of electrical contacts 16 (FIG. 3) extend outwardly from the face plate 12. Previously, the electrical contact 16 have been used for electrical connection with meter jaws in meter boxes. However, as has been set forth, there still remain a number of multiphase electrical power installations where power leads or contacts to be tested for phase rotation are not contained in a meter box.

Figure 1:
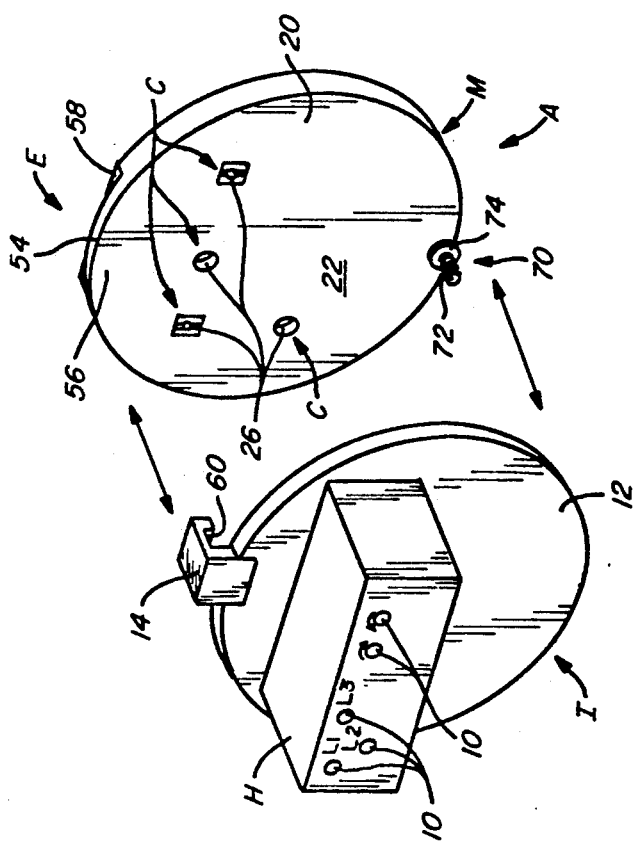
FIG. 1 is an exploded isometric view of a test lead adapter of the present invention with a phase rotation indicator.

Considering now the test lead adapter A, an insulative plate member M has a number of electrical terminals or connector points T (FIGS. 2 and 4) mounted on it. The terminals T are each adapted for connection to one of a set of multiphase electrical power test points. The adapter A also includes a suitable number of electrical contacts C (FIGS. 1 and 3) mounted on the plate member M and connected to corresponding ones of the terminals T.

The electrical contacts C are adapted for engagement with the electrical contacts or connectors 16 of the phase rotation indicator I. The adapter A also includes engaging structure E on the plate member M for engaging the hanger jaw mounting structure 14 of the phase rotation indicator I. As will be set forth, the engaging structure E permits alignment of the electrical contacts C with the electrical connector contacts 16 of the phase rotation indicator I.

The insulative plate member M is a generally circular disk 20 formed of a suitable insulative or dielectric material and having a front connector face 22 and a rear connector face 24 formed thereon. A suitable number of contact recesses 26 are formed in the first or front connector face 22 of the plate member 20. Each of the contact recesses 26 is adapted to receive one of the electrical contacts C therein.

The number of contact recesses 26 and their location may vary according to the type of phase rotation indicator that a particular adapter A is intended for use with. Optionally, the adapter A may have contact recesses 26 located for general use with several indicators. In this situation, some recesses 26 may come into use only with particular adapters.

Depending upon the type of phase rotation indicator I, the electrical contacts C may take either the form of a conductive contact head or stud 28 mounted in one of the contact recesses 26 or, alternatively, connector jaw members 30 mounted in one of the contact recesses 26. The conductive contact heads 28 are adapted to be engaged by contact probes or plunger members when such probes are used as electrical contacts 16 with the phase rotation indicators I. Alternatively, the connector jaw members 30 may be of the same general structure as conventional meter jaws within meter boxes. The connector jaw members 30 are adapted to receive therein connector blade members when such blade members are used as electrical contacts 16 of the phase rotation indicator I.

Mounted within the disk 20 of the insulative plate member M inwardly of the electrical contacts C in the contact recesses 26 are electrical conductors 32 (FIG. 3) which extend between the electrical contacts C and the terminals T on the rear connector face 24. The terminals T may take the form of electrically conductive rods 36 having threaded external surfaces 38. Typically, the terminals 36 are held in place in the disk member 20 by bolts or nuts 40 or other suitable mounting structure. The threaded external surfaces 38 of the conductive terminals 36 are adapted to engage and receive insulated nut caps 42.

The terminals T are adapted to receive connector jaws 44 (FIGS. 3 and 4) formed at the end of wires 46 of flexible test leads 48, one of which is shown. The test leads 48 typically further include suitable connector structures such as gripping jaw members 52 mounted within insulative covers 53 which are connectable to multiphase electrical power terminals in which the phase rotation is to be tested by the multiphase indicator I. Three such test leads 48 are used in typical working applications.

The engaging structure E of the adapter A has a raised lip 54 extending outwardly from the plate member M at an upper portion 56 thereof. The raised lip 54 extends rearwardly from the front connector face 22 a portion of the thickness of the disk 20 in front of a flat surface 58 formed by removing a portion of the disk 20 behind the raised lip 54. The raised lip 54 is of a thickness to fit within the width of a gap 60 (FIG. 3) formed in the hanger jaw 14 of the phase rotation indicator I.

The raised lip 54 and the electrical contacts C within the contact recesses 26 of the adapter A according to the present invention are formed on the plate member M at locations conforming to those of the hanger jaw 14 of the phase rotation indicator I and the electrical connectors 16 of one or more types of phase indicators. In this manner, the phase rotation indicator I may be easily attached by fitting the raised lip 54 of the adapter A into the gap 60 of the hanger jaw 14, placing the electrical contacts 16 of the indicator I in alignment with the electrical contacts C of the adapter A.

A connector mechanism 70 is also preferably provided as a part of the test adapter A. The connector mechanism 70 includes a threaded, hold-down screw 72 formed extending outwardly through a cushion member 74 on the front connector face 22 of the disk member 20. The hold-down screw 72 passes through a keeper sleeve 76 held in place by a nut 78 or other suitable fastening means.

The hold-down screw 72 may be advanced or retracted by means of a nut 80 extending outwardly from the rear connector face 24 of the disk member 20. If desired, as indicated, a suitable type of slot or receptor socket may be formed in the head member 80 for ease of movement of the hold-down screw 72. The threaded outer end of the hold-down screw 72 is adapted for connection with a receptor socket 82 formed in the face plate 12. The receptor socket 82 is formed at a location on the face plate 12 with respect to the hanger jaw 14 corresponding to the location of the hold-down screw 72 with respect to the engaging structure E of the adapter A.

In the operation of the present invention, the adapter A may be used as a transport/storage mechanism for the phase rotation indicator I on the transport or service truck. The adapter A is connected to the phase rotation indicator by fitting the raised lip 54 of the engaging structure E into the gap 60 in the hanger jaw 14 and inserting the hold-down screw 72 through the correspondingly aligned receptor socket 82 in the face plate 12. In this way, the adapter A and the phase rotation indicator I compactly fit together so that the adapter A functions as a protective carrying or transport cover for the indicator I. In addition to the protective function performed, transport space on the service truck is also saved due to the interfitting compact engagement between the indicator I and adapter A.

When it is desired to test the phase rotation of power leads which are not contained in a meter box, it is not necessary to remove the adapter A from the indicator I. The connector jaws 44 of the test leads 48 are connected to the terminals T with the adapter A still mounted to the indicator I. The power leads may then be connected to the opposite end of the test leads 48. The phase rotation indicator lights 10 then indicate the phase rotation measurements.

It is also easy to use the adapter A in situations where the phase rotation indicator I has been in use separate from the adapter A and it becomes desirable to test the phase rotation of electrical power leads which are not in boxes. In such a case, the adapter A is once again remounted with the phase rotation indicator I by means of the engaging structure E and the connector screw 72. With the adapter A again connected to the phase rotation indicator I, the test leads 48 may then be attached to the power leads to be tested.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

I claim:

1. An adapter for connecting multiphase electrical power conductors with electrical contacts of a phase rotation indicator having a hanger jaw mounting apparatus therewith, the phase rotation indicator including a test circuit to test the phase rotation of the multi-phase power in the power conductors, comprising:

an insulative plate member;

terminal means mounted on said plate member for connection to each of the multiphase electrical power conductors;

electrical contact means on said plate member connected to said terminal means and adapted for engagement with the electrical contacts of the phase rotation indicator;

means on said plate member comprising a raised lip extending outwardly from said plate member for fitting into the hanger jaw of the mounting apparatus for engaging the mounting apparatus to align said electrical contact means with the electrical connectors of the phase rotation indicator.

2. The adapter of claim 1, wherein:
said insulative plate member comprises a member formed of insulative material and having opposite connector faces formed thereon.

3. The adapter of claim 2, further including:
contact recesses formed in a first connector face of said plate member.

4. The adapter of claim 3, wherein:
said electrical contact means comprises conductive contact heads mounted in said contact recesses.

5. The adapter of claim 3, wherein:
said electrical contact means comprises connector jaw members mounted in said contact recesses.

6. The adapter of claim 2, further including:
electrical conductors in said plate member extending between said electrical contact means of said terminal means.

7. The adapter of claim 2, wherein:
said electrical contact means are mounted on a first connector face of said opposite faces of plate member;
said terminal means are mounted on an opposite connector face from said first connector face of said plate member from said electrical contact means.

8. The adapter of claim 2, wherein said terminal means comprise:
conductive terminals extending from a connector face of said plate member; and
an insulated nut movably mounted on each of said conductor terminals for connection of said power conductors to the terminal means.

9. The adapter of claim 8, further including:
terminal mounting means for mounting said conductive terminals on said disk member.

10. The adapter of claim 9, wherein:
receptor sockets are formed on said opposite face of said plate member;
said terminal mounting means are receivable in said receptor sockets.

11. The adapter of claim 1, wherein:
said raised lip and said electrical contact means are mounted on said plate member at locations conforming respectively those of the hanger jaw of the mounting apparatus and the electrical connectors of the phase rotation indicator.

12. The adapter of claim 11, further including:
means with said plate member for connecting same to the mounting apparatus.

13. The adapter of claim 12, wherein said means for connecting comprises:
a hold down screw extending from said plate member for connection to the phase rotation indicator.

14. The adapter of claim 13, further including:
a cushion member mounted on said plate member and fitted about said hold down screw.

15. The adapter of claim 1, wherein:
said insulative plate member comprises a generally circular disc formed of insulative material and having opposite connector faces formed thereon.

16. The apparatus of claim 1, further including:
a flat surface formed behind said raised lip on said plate member.

17. The apparatus of claim 1, further including:
test leads connectable to said terminal means for connection to the multiphase electrical power.

* * * * *